United States Patent
Eom

(10) Patent No.: US 9,554,492 B2
(45) Date of Patent: Jan. 24, 2017

(54) POWER CONVERTER

(71) Applicant: LSIS CO., LTD., Anyang-si, Gyeonggi-do (KR)

(72) Inventor: Jun Seok Eom, Pyeongtaek-si (KR)

(73) Assignee: LSIS CO., LTD., Anyang-si (KR)

( * ) Notice: Subject to any disclaimer, the term of this patent is extended or adjusted under 35 U.S.C. 154(b) by 33 days.

(21) Appl. No.: 14/264,936

(22) Filed: Apr. 29, 2014

(65) Prior Publication Data

US 2015/0070847 A1    Mar. 12, 2015

(30) Foreign Application Priority Data

Sep. 12, 2013    (KR) .................. 20-2013-0007679 U

(51) Int. Cl.
*H05K 7/20*    (2006.01)
*H01L 23/40*    (2006.01)

(52) U.S. Cl.
CPC .......... *H05K 7/209* (2013.01); *H01L 23/4093* (2013.01); *H01L 2924/0002* (2013.01)

(58) Field of Classification Search
CPC ... H05K 7/209; H01L 23/4093; H01L 23/473; H01L 2924/0002; B60K 6/48; B60L 15/007
USPC .......................... 361/689, 717; 363/141, 144
See application file for complete search history.

(56) References Cited

U.S. PATENT DOCUMENTS

| | | | |
|---|---|---|---|
| 4,712,159 A | 12/1987 | Clemens | |
| 5,671,118 A * | 9/1997 | Blomquist | .......... H01L 23/4093 174/16.3 |
| 5,860,195 A * | 1/1999 | Wang | ................. H01L 23/4093 165/80.3 |
| 5,979,025 A * | 11/1999 | Horng | ................. H01L 23/4093 165/80.3 |

(Continued)

FOREIGN PATENT DOCUMENTS

| | | |
|---|---|---|
| DE | 102011004541 | 8/2012 |
| EP | 1840963 | 10/2007 |

(Continued)

OTHER PUBLICATIONS

Japan Patent Office Application Serial No. 2014-106708, Office Action dated Mar. 25, 2015, 4 pages.

(Continued)

*Primary Examiner* — Anthony Haughton
*Assistant Examiner* — Matt Dhillon
(74) *Attorney, Agent, or Firm* — Lee Hong Degerman Kang & Waimey

(57) ABSTRACT

A power converter is provided. The power converter includes a heat sink provided with a holding unit, a plurality of semiconductor devices disposed on the heat sink, and a fixing assembly pressing each of the semiconductor devices toward the heat sink to fix the semiconductor device. The fixing assembly includes a lower push unit disposed on the semiconductor device, and an upper push unit disposed on the lower push unit to press the lower push unit downward, the upper push unit being coupled to the holding unit. The (Continued)

upper push unit includes a central bent part that partially protrudes downward, an insertion part disposed on each of both ends of the central bent part in a left/right direction, the insertion part having a left/right distance therebetween that gradually increases upward, and a fixing bar inserted into the insertion part.

13 Claims, 5 Drawing Sheets

(56) References Cited

U.S. PATENT DOCUMENTS

| | | | | |
|---|---|---|---|---|
| 6,021,044 | A * | 2/2000 | Neville, Jr. | G06F 1/20 165/104.33 |
| 6,056,579 | A * | 5/2000 | Richards, III | H01R 12/7005 439/327 |
| 6,111,752 | A * | 8/2000 | Huang | H01L 23/4093 165/80.2 |
| 6,116,566 | A * | 9/2000 | Brown | H05K 7/1431 248/694 |
| 6,257,533 | B1 * | 7/2001 | Pei | H01L 23/4093 248/200 |
| 6,343,015 | B1 * | 1/2002 | Huang | H01L 23/4093 165/185 |
| 6,370,024 | B1 * | 4/2002 | Lo | H01L 23/4093 165/185 |
| 6,370,036 | B1 * | 4/2002 | Boe | H05K 7/1431 24/563 |
| 6,404,635 | B1 * | 6/2002 | Wei | H01L 23/4093 165/80.3 |
| 6,430,049 | B1 * | 8/2002 | Lai | H01L 23/4093 165/80.3 |
| 6,471,533 | B2 * | 10/2002 | Lai | H01L 23/4093 257/E23.086 |
| 7,561,429 | B2 * | 7/2009 | Yahata | H02M 7/003 165/104.33 |
| 8,188,829 | B2 * | 5/2012 | Nakahori | H01F 27/2804 336/196 |
| 2006/0042054 | A1 * | 3/2006 | Kippes | H01L 23/4093 24/458 |
| 2007/0030652 | A1 * | 2/2007 | Chen | H01L 23/4093 361/704 |
| 2009/0168358 | A1 | 7/2009 | Koike et al. | |

FOREIGN PATENT DOCUMENTS

| | | |
|---|---|---|
| JP | 2006-136189 | 5/2006 |
| JP | 2009-130964 | 6/2009 |
| JP | 2012-227345 | 11/2012 |
| JP | 2013-243264 | 12/2013 |

OTHER PUBLICATIONS

European Patent Office Application Serial No. 14177923.1, Search Report dated May 15, 2015, 7 pages.

* cited by examiner

POWER CONVERTER

Pursuant to 35 U.S.C. §119 (a), this application claims the benefit of earlier filing date and right of priority to Korean Patent Application No. 20-2013-0007679, filed on Sep. 12, 2013, the contents of which are hereby incorporated by reference in their entirety.

BACKGROUND

The present disclosure relates to a power converter, and particularly, to a power converter to which a semiconductor device is easily coupled.

Power converters means devices that convert certain power into power that is different in current, voltage, frequency, and so on.

Recently, each of most power converters includes a printed circuit board (PCB) and a plurality of semiconductor devices mounted on the PCB.

FIG. 1 is a schematic view of a power converter according to a related art.

Referring to FIG. 1, in a power converter according to a related art, a coupling hole 20A is defined in a heat sink 20 fixed to a printed circuit board (PCB) 10, and a fixing hole 30a is defined in an upper portion of a semiconductor device for power to match the coupling hole 20A, thereby fixing the semiconductor device 30 for power to the heat sink 20 by coupling a screw 40.

However, such the semiconductor device for power has a fixing structure in which the semiconductor device for power is fixed to and separated from the heat sink by manually tightening and releasing the screw one by one when the semiconductor device for power is coupled to the heat sink. As a result, the attachment/detachment of the semiconductor device for power may be cumbersome and inconvenient, and thus productivity may be deteriorated.

Since the PCB and the semiconductor device are coupled to each other by using a bolt after being soldered, torsion may occur in the semiconductor device while the PCB and the semiconductor device are coupled to each other by using the bolt. Therefore, the power converter may be deteriorated in durability.

SUMMARY

Embodiments provide a power converter in which a semiconductor device is capable of being easily coupled without using a bolt.

In one embodiment, a power converter includes: a heat sink provided with a holding unit; a plurality of semiconductor devices disposed on the heat sink; and a fixing assembly pressing each of the semiconductor devices toward the heat sink to fix the semiconductor device; wherein the fixing assembly includes: a lower push unit disposed on the semiconductor device; and an upper push unit disposed on the lower push unit to press the lower push unit downward, the upper push unit being coupled to the holding unit.

The holding unit may include a groove that recessed downward, and the upper push unit may include: a central bent part that partially protrudes downward; and an insertion part disposed on each of both ends of the central bent part in a left/right direction, the insertion part having a left/right distance therebetween that gradually increases upward.

The fixing assembly may further include a fixing bar inserted into the insertion part.

The central bent part may have a central portion that protrudes downward and both ends each of which extends upward.

The insertion part may include an inner portion extending downward from the central bent part and an outer portion extending upward from a lower end of the inner portion, wherein a distance between the inner and outer portions may gradually increase in an upward direction in a state where an external force is not applied thereto.

The outer portion may be provided with a projection that protrudes outward.

An outer surface of the projection may be further inclined than that of the outer portion.

A protrusion that is instable into the projection may be provided on one surface of the fixing bar.

The lower push unit may include a cutoff part to which the upper push unit is coupled.

The lower push unit may include: a horizontal extension part having a plate shape, the horizontal extension part extending in the left/right direction; and a vertical extension part extending upward from the horizontal extension part; wherein the cutoff part may be defined on an upper end of the vertical extension part.

The cutoff part may include: a small width portion having a relatively small width in the front/rear direction; and a large width portion defined below the small width portion, the large width portion having a width greater than that of the small width portion.

The plurality of semiconductor devices may be parallelly disposed along the extensional direction of the horizontal extension part.

The heat sink may further include a device seating unit that protrudes upward, and the semiconductor devices may be disposed on the device seating unit.

Each of the semiconductor devices may have a bottom surface that is in surface contact with a top surface of the device seating unit.

In another embodiment, a power converter includes: a heat sink provided with a holding unit; a plurality of semiconductor devices disposed on the heat sink; a lower push unit contacting top surfaces of the plurality of semiconductor devices; and an upper push unit in contact with a top surface of the lower push unit, the upper push unit being detachable to the heat sink; wherein when the upper push unit is coupled to the holding unit, the upper push unit presses the lower push unit downward, and the lower push unit presses the semiconductor devices downward to fix the semiconductor devices to an upper portion of the heat sink.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Hereinafter, a power converter according to an embodiment will be described with reference to the accompanying drawings.

Figure 1:
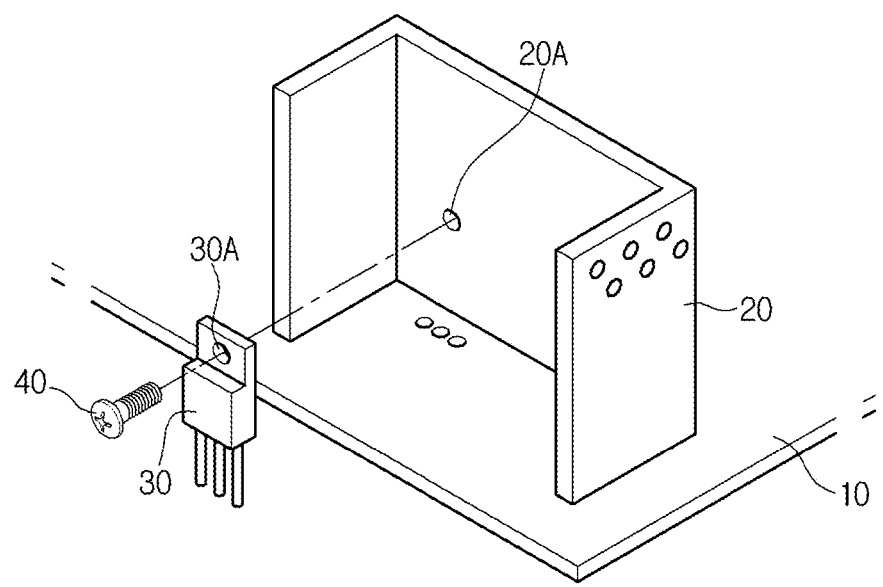
FIG. 1 is a schematic view of a power converter according to a related art.
Figure 2:
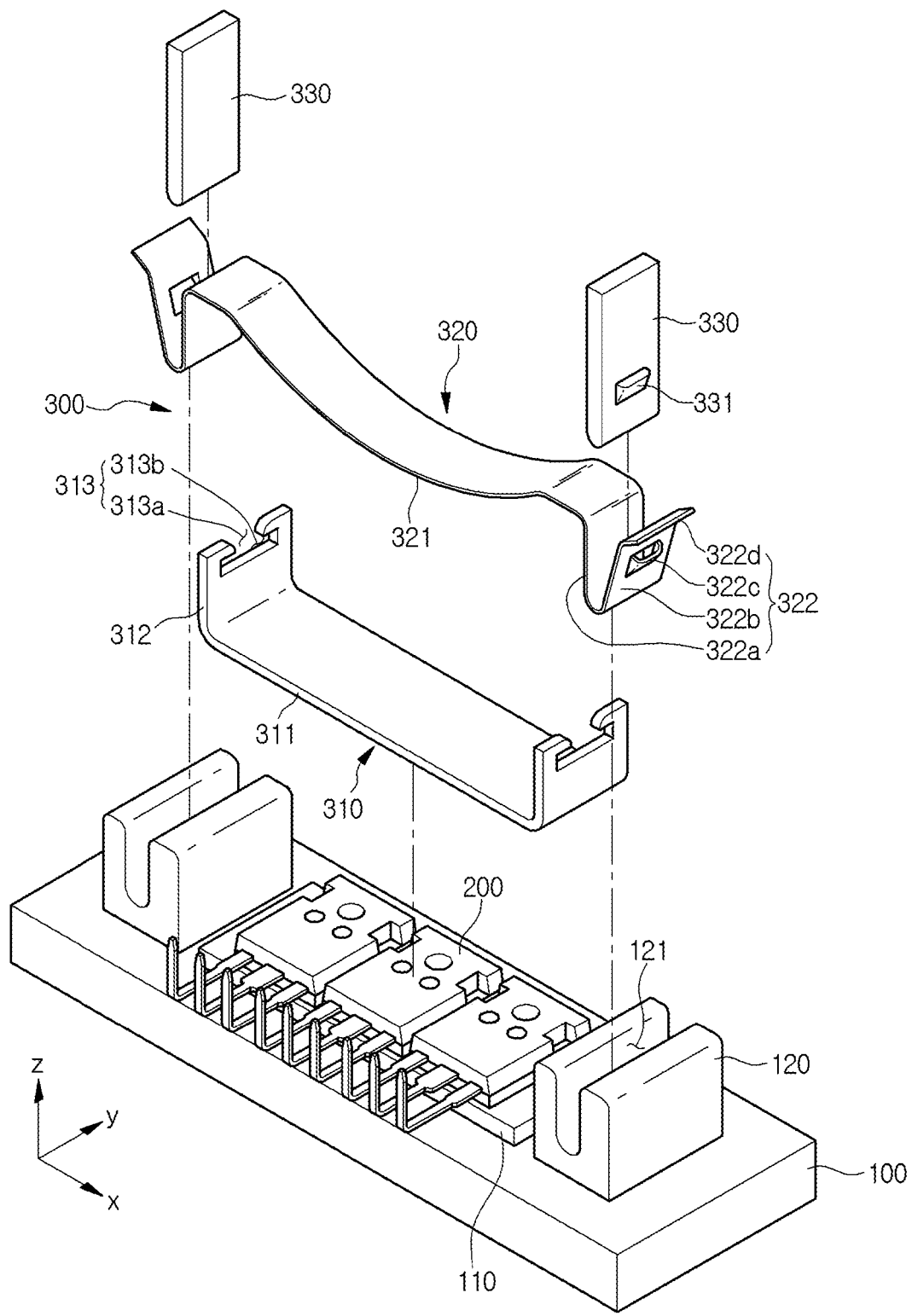
FIG. 2 is an exploded perspective view illustrating a portion of a power converter according to an embodiment.
Figure 3:
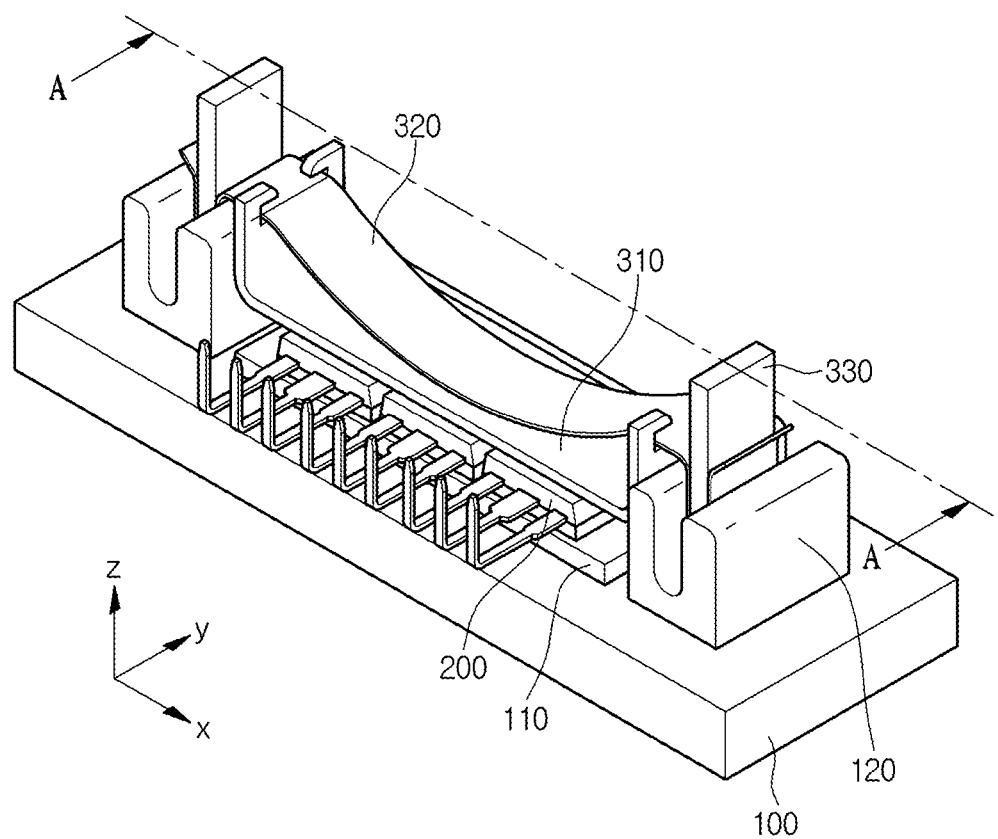
FIG. 3 is a perspective view of a portion of the power converter according to an embodiment.
Figure 4:
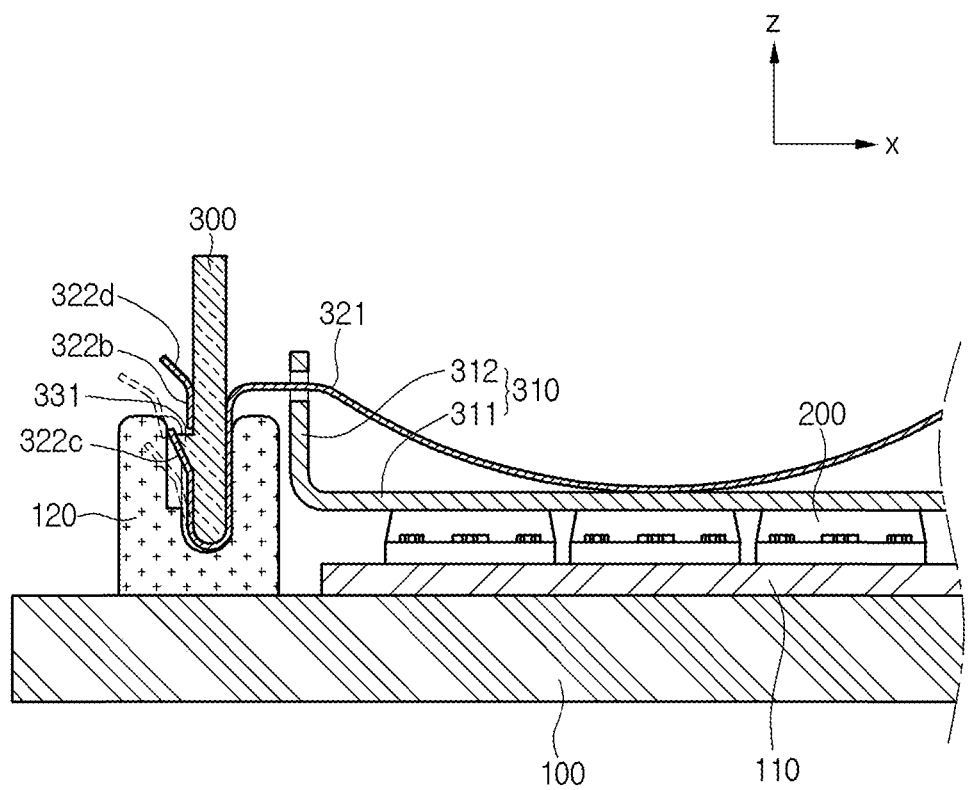
FIG. 4 is a cross-sectional view taken along line A-A of FIG. 3.
Figure 5:
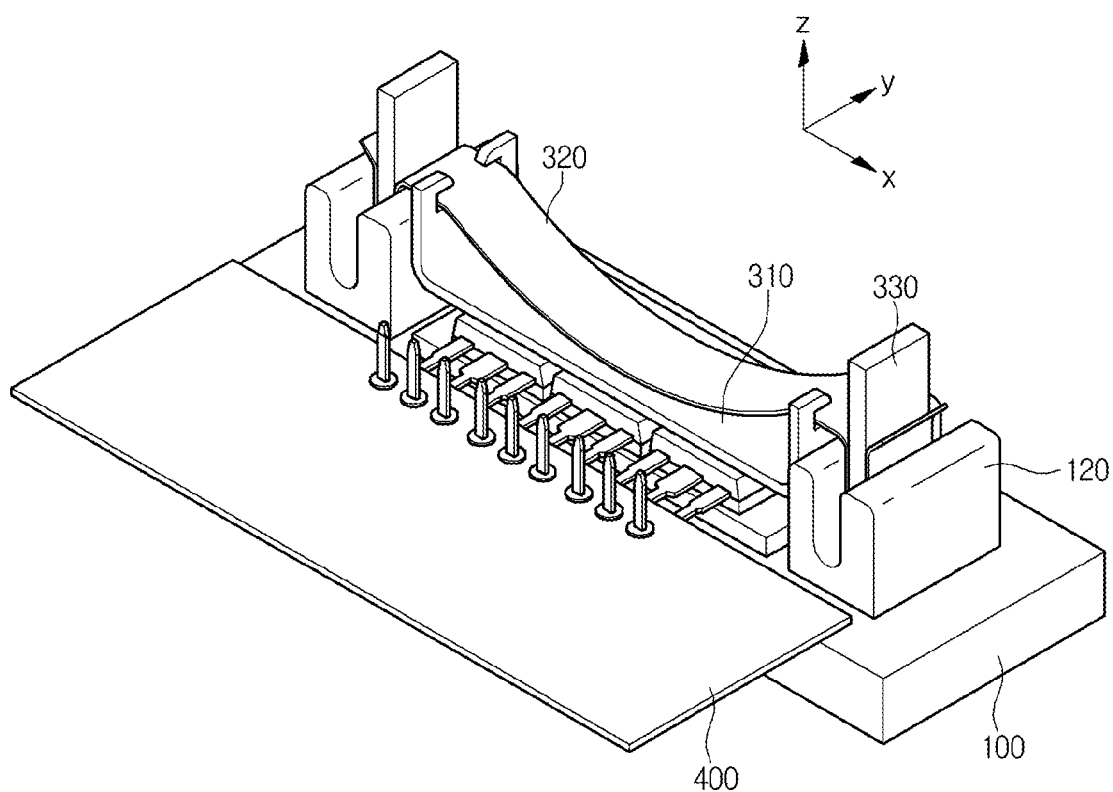
FIG. 5 is a perspective view of a portion of the power converter according to an embodiment.

FIG. 2 is an exploded perspective view illustrating a portion of a power converter according to an embodiment, FIG. 3 is a perspective view of a portion of the power converter according to an embodiment, FIG. 4 is a cross-sectional view taken along line A-A of FIG. 3, and FIG. 5 is a perspective view of a portion of the power converter according to an embodiment.

Referring to FIGS. 2 and 5, a power converter according to an embodiment includes a heat sink 100, a semiconductor device 200, and a fixing assembly 300. Also, the power converter includes a printed circuit board (PCB) 400.

Explaining each of the components of the power converter in more detail, the heat sink 100 includes a device seating unit 110 and a holding unit 120.

The device seating unit 110 may be a unit on which the semiconductor device 200 that will be described later is seated. The device seating unit 110 may lengthily extend along a direction in which the plurality of semiconductor devices 200 are arranged in parallel to each other. For example, if the plurality of semiconductor devices 200 are arranged along a first direction (an X-axis direction), the device seating unit 110 may also extend along the first direction (the X-axis direction). The device seating unit 100 may have a shape that relatively protrudes upward when compared to other parts thereof, but is not limited thereto.

The holding unit 120 protrudes upward, and a groove 121 is defined in a central portion of the holding unit 120. The groove 121 may have an approximately U-shape. In more detail, if it is assumed that a certain direction that is perpendicular to the first direction (the X-axis direction) is defined as a second direction (a Y-axis direction), the groove 121 may have an approximately U-shape when viewed in the second direction (the Y-axis direction). The groove 121 has a predetermined width in the second direction (the Y-axis direction). For reference, hereinafter, left and right directions are defined as the first direction (the X-axis direction), and front and rear directions are defined as the second direction (the Y-axis direction).

Such the heat sink 100 is formed of a material having a great thermal conductivity coefficient to provide excellent heat radiation performance. For example, the heat sink 100 may be formed of aluminum (Al) or an alloy including the same. Since each of the semiconductor devices used in the power converter has a characteristic that emits heat during the operation thereof, if the heat is not properly emitted from the semiconductor devices, the semiconductor devices may be overheated to cause fatal defects therein. Thus, it is necessary to dissipate the heat through the heat sink 100. In this respect, the device seating unit 100 may have a flat top surface to surface-contact each of the semiconductor devices 200 disposed thereon.

The semiconductor device 200 may perform a switching function within the power converter. For example, the semiconductor device 200 may be a field effect transistor (FET), a metal oxide semiconductor field effect transistor (MOSFET), an insulated gate bipolar mode transistor (IGBT), and the like. The semiconductor device 200 is provided in plurality. The plurality of semiconductor devices 200 are parallelly disposed along the first direction (the X-axis direction) as described above. Here, the plurality of semiconductor devices 200 may have pins that protrude in one direction, i.e., the same direction. That is, the pin of one semiconductor device 200 and the pin of the other semiconductor device 200 may protrude in the same direction with respect to the one direction, e.g., the second direction. However, the present disclosure is not limited to. Also, each of the semiconductor devices 200 may have a flat bottom surface to surface-contact the top surface of the heat sink 200 as described above.

Hereinafter, the fixing assembly 300 will be described.

The fixing assembly 300 includes a lower push unit 310, an upper push unit 320, and a fixing bar 330.

In detail, the lower push unit 310 includes a horizontal extension part 311, a vertical extension part 312, and a cutoff part 313.

The horizontal extension part 311 has a flat plate shape and further extends in the first direction than the second direction. That is, the horizontal extension part 311 has a predetermined width in the second direction and lengthily extends along the first direction.

The vertical extension part 312 is provided on each of both left and right ends of the horizontal extension part 311. The vertical extension part 312 extends upward from each of both ends of the horizontal extension part in the first direction. Here, the vertical direction may be defined as a third direction (a Z-axis direction) crossing to the first (the X-axis direction) and second (the Y-axis direction) directions. The cutoff part 313 may be defined on an upper end of the vertical extension part 312. The cutoff part 313 is defined by cutting a portion of the upper end of the vertical extension part 312.

The cutoff part 313 includes a small width portion 313a and a large width portion 313b. The small width portion 313a is defined from the upper end of the vertical extension part 313 to a predetermined lower portion of the vertical extension part 313 and has a relatively small width. The large width portion 313b is defined below the small width portion 313a and has a width relatively greater than that of the small width portion 313a. In more detail, the small width portion 313a has a width extending along the second direction, which is relatively less than that of the large width portion 313b, and the large width portion 313b has a width extending along the second direction, which is relatively greater than that of the small width portion 313a.

The upper push unit 320 includes a central bent part 321 and an insertion part 322.

The central bent part 321 has a shape that partially protrudes downward. In detail, the central bent part 321 has a bent shape so that a central portion thereof protrudes downward. The central bent part 321 is formed of an elastically deformable material. Thus, when the drooped down central portion of the central bent part 321 contacts the lower push unit 310, the central bent part 321 may be elastically deformed.

The insertion part 322 is inserted into the above-described holding unit 120 of the heat sink 100 and has an approximately U-shaped section when viewed in the front/rear direction (the second direction), but, the present disclosure is not limited thereto. For example, the insertion part 322 may have an approximately V-shaped section. That is, the insertion part 322 has a shape that is gradually horizontally spread upward from a lower portion thereof. That is, the insertion part 322 has a shape which extends downward from an inner end adjacent to the central bent part 321 and then extends upward again from a predetermined position thereof. Here, an inner portion in the left/right direction is defined as an inner portion 322a, an outer portion in the left/right direction is defined as an outer portion 322b with respect to the lower end.

The inner portion 322a and the outer portion 322b have a distance therebetween (a distance in the left/right direction, that is, the second direction) gradually increasing upward. For this, at least one of the inner and outer portions 322a and 322b may inclinedly extend. In FIGS. 2 to 5, the inner portion 322a vertically extends, and only the outer portion 322b inclinedly extends when an external force is not applied. However, the present disclosure is not limited thereto. For example, the inner portion 322a may inclinedly extend, and the outer portion 322b may vertically extend as described above.

The projection 322c further protrudes outward from a portion of the outside of the insertion part 322. In more detail, an outer surface of the outer portion 322b further protrudes outward in the left/right direction (the first direction), and thus the outer surface is inclined. An outer surface of the projection 322c is further inclined when compared to the outer portion 322b. That is, if it is assumed that the inner portion 322a vertically extends, the inner portion 322a and the outer surface of the projection 322c have an angle therebetween, which is greater than that between the inner portion 322a and the outer surface of the outer portion 322b. Thus, as illustrated as a solid line in FIG. 4, even through the outer portion 322b vertically stands, the outer portion 322b still has the shape that is gradually inclined in an upward direction.

An inclined end 322d inclinedly extending outward is provided on an upper end of the outer portion 322b. Since the inclined end 322d is provided, the insertion part 322 may be easily retracted with a relatively small power when assembled.

The central bent part 321 and the insertion part 322 may be integrally formed. That is, the push unit 320 may be provided in one member.

The upper push unit 320 may a function similar to that a plate spring on the whole. Thus, the upper push unit 320 may be formed of an elastically deformable material, such as plastic, other synthetic resins, or the like.

The lower push unit 310 is coupled to the upper push unit 320 as illustrated in FIGS. 3 and 4. Here, the central bent part 321 of the upper push unit 320 is fitted into the cutoff part 313 so that the upper push unit 320 passes through the cutoff part 313 provided in the vertical extension part 312 of the lower push unit 310 in the left/right direction.

The fixing bar 330 is a member having an approximately rectangular shape that extends in the vertical direction (the third direction, i.e., the Z-axis direction). The fixing bar 330 is fitted between the inner portion 322a and the outer portion 322b when the power converter is assembled. Here, the inner and outer parts 322a and 322b may be in a state where both are previously inserted into a groove 121. Thus, each of the fixing bar 330, the inner portion 322a, and the outer portion 322b has a width in the left/right direction (the first direction), which is capable of being tightly fitted into the grove 121 of the holding unit 120.

The protrusion 331 is provided on the fixing bar 330. The protrusion 331 further protrudes outward from the outer surface of the fixing bar 330 in the left/right direction. The protrusion 331 has an inclined shape which gradually outwardly protrudes upward from a lower portion thereof. That is, when viewed in the second direction, the protrusion 331 has an approximately right-angled triangular section. The protrusion 331 is a portion that is fitted into the projection 322c of the insertion part 322.

When a lower end of the insertion part 322 is rounded, a lower end of the fixing bar 330 may also be rounded to correspond to that of the insertion part 322.

Hereinafter, a coupling method of the power converter having the above-described constitutions will be described with reference to FIGS. 4 and 5.

FIG. 5 is a view illustrating a state where the semiconductor illustrated in FIG. 3 is coupled to a printed circuit board (PCB) 400.

Referring to FIG. 5, a plurality of holes into which pins of semiconductor devices 200 are inserted may be defined in a printed circuit board (PCB) 400. Each of the pins of the semiconductor devices 200 and a pattern formed on the PCB 400 are connected to each other by soldering, and so on.

When the semiconductor device 200 is coupled to the PCB 400, the semiconductor device 200 is placed on a device mounting unit 110 of a heat sink 100.

Then, a fixing assembly 300 is fitted into a holding unit 200 of the heat sink 100.

When the fixing assembly 300 is pressed downward in a state where the fixing assembly 300 is located above the holding unit 200, an insertion part 322 of an upper push unit 320 is elastically deformed and inserted into a groove 121 of a holding unit 120. When an external force is not applied to the insertion part 322, as illustrated as a solid line in FIG. 5, although the insertion part 322 has a left/right width greater than that of the groove 121, an inner portion 322a and an outer portion 322b of the insertion part 322 decreases in distance therebetween while the insertion part 322 is inserted into the groove 121, and thus the insertion part 322 may be inserted into the groove 121 of the holding unit 120 due to the elastic deformation.

Then, the fixing bar 330 is inserted between the inner and outer parts 322a and 322b of the insertion part 322. When the fixing bar 330 is completely inserted, a protrusion 331 of the fixing bar 340 is fitted into the projection 322c of the insertion part 322. In this insertion process, the protrusion 331 may be elastically deformed.

When the power converter according to an embodiment is installed on a position at which vibration occurs, like the inside of an electric vehicle, the fixing bar 330 is fitted into the insertion part 322 so as to prevent the insertion part 322 from being elastically deformed and thus separated outside from the groove 121 due to the repeated vibration.

When the fixing assembly 300 is coupled to the heat sink 100 through the above-described process, a center of a central bent part 321 of the upper push unit 320 may press a horizontal extension part 311 of a lower push unit 310 downward, and the lower push unit 310 may again press the plurality of semiconductor devices 200 toward the heat sink 100 disposed thereunder. Thus, the semiconductor devices 200 may be firmly fixed to the heat sink 100.

Therefore, since the semiconductor devices 200 may be coupled to the heat sink 100 without using a bolt, a process for coupling the bolt as well as a process for forming a bolt insertion hole may be omitted to reduce the number of manufacturing processes, thereby improving a working speed.

Also, torsion of the device occurring in the bolt-coupling process may be prevented to increase product reliability and improve durability.

According to the embodiment, since the semiconductor device is easily assembled without using the bolt, the number of assembly processes and components may be reduced, as well as, manufacturing costs may be reduced.

Moreover, the products may increase in durability.

If a person of ordinary skill in the art to which this invention pertains without departing from the essential characteristics of the present invention in the range described above, is only the spirit of the present invention have been described for illustrative purposes, various modifications, additions and substitutions are possible.

Therefore, to explain the embodiments disclosed in the present disclosure is not limited to the technical idea of the present disclosure, and are not limited by this embodiment without departing from the scope or spirit of the invention.

The scope of protection of the present disclosure, all the technical idea, within the scope of its equivalent shall be construed by the following claims should be construed as being included in the scope of the present disclosure.

What is claimed is:

1. A power converter comprising:
    a heat sink;
    a holding unit located on the heat sink and comprising a first part shaped to define a first groove and a second part shaped to define a second groove;
    a plurality of semiconductor devices disposed on the heat sink and located between the first part of the holding unit and the second part of the holding unit; and
    a fixing assembly pressing each of the semiconductor devices toward the heat sink;
    wherein the fixing assembly comprises:
    a lower push unit located between the first part of the holding unit and the second part of the holding unit, wherein the lower push unit comprises a top side and a bottom side, wherein the bottom side of the lower push unit contacts each of the semiconductor devices;
    an upper push unit comprising a central bent part that extends between a first insertion part and a second insertion part, wherein the central bent part partially protrudes downward and is elastically deformed such that a bottom side of the central bent part contacts the top side of the lower push unit, and wherein the first insertion part is received within the first groove and the second insertion part is received within the second groove; and
    a fixing bar inserted into the first groove and the second groove to couple the upper push unit to the holding unit.

2. The power converter according to claim 1, wherein the central bent part has a central portion that protrudes downward and both ends each of which extends upward.

3. The power converter according to claim 1, wherein each of the first insertion part and the second insertion part comprise an inner portion extending downward from the central bent part and an outer portion extending upward from a lower end of the inner portion,
    wherein a distance between the inner and outer portions gradually increases in an upward direction in a state where an external force is not applied thereto.

4. The power converter according to claim 3, wherein the outer portion is provided with a projection that protrudes outward.

5. The power converter according to claim 4, wherein an outer surface of the projection is further inclined relative to that of the outer portion.

6. The power converter according to claim 4, wherein a protrusion that is insertable into the projection is provided on one surface of the fixing bar.

7. The power converter according to claim 6, wherein the lower push unit comprises a first cutoff part and a second cutoff part to which the upper push unit is coupled.

8. The power converter according to claim 7, wherein the lower push unit comprises:
    a horizontal extension part having a plate shape, the horizontal extension part extending in the left/right direction; and
    a first vertical extension part and a second vertical extension part each extending upward from the horizontal extension part;
    wherein the first cutoff part is defined on an upper end of the first vertical extension part and the second cutoff part is defined on an upper end of the second vertical extension part.

9. The power converter according to claim 8, wherein each of the first cutoff part and the second cutoff part comprises:
    a small width portion having a relatively small width in the front/rear direction; and
    a large width portion defined below the small width portion, the large width portion having a width greater than that of the small width portion.

10. The power converter according to claim 9, wherein the plurality of semiconductor devices are disposed in parallel along the extensional direction of the horizontal extension part.

11. The power converter according to claim 1, wherein the heat sink further comprises a device seating unit that protrudes upward, and
    the semiconductor devices are disposed on the device seating unit.

12. The power converter according to claim 11, wherein each of the semiconductor devices has a bottom surface that is in surface contact with a top surface of the device seating unit.

13. A power converter comprising:
    a heat sink;
    a holding unit located on the heat sink and comprising a first part shaped to define a first groove and a second part shaped to define a second groove;
    a plurality of semiconductor devices disposed on the heat sink and located between the first part of the holding unit and the second part of the holding unit; and
    a lower push unit located between the first part of the holding unit and the second part of the holding unit, wherein the lower push unit comprises a top side and a bottom side, wherein the bottom side of the lower push unit contacts top surfaces of the plurality of semiconductor devices; and
    an upper push unit comprising a central bent part that extends between a first insertion part and a second insertion part, wherein the central bent part partially protrudes downward and is elastically deformed such that a bottom side of the central bent part contacts the top side of the lower push unit, and wherein the upper push unit is detachable from the heat sink;
    wherein when the upper push unit is coupled to the holding unit, the upper push unit presses the lower push unit downward, and the lower push unit presses the semiconductor devices downward to fix the semiconductor devices to an upper portion of the heat sink.

* * * * *